US012490443B2

(12) United States Patent
Guo et al.

(10) Patent No.: US 12,490,443 B2
(45) Date of Patent: Dec. 2, 2025

(54) HYBRID ISOLATION CAPACITORS IN SERIES

(71) Applicant: TEXAS INSTRUMENTS INCORPORATED, Dallas, TX (US)

(72) Inventors: Honglin Guo, Dallas, TX (US); Thomas D. Bonifield, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 908 days.

(21) Appl. No.: 17/512,194

(22) Filed: Oct. 27, 2021

(65) Prior Publication Data

US 2023/0129461 A1    Apr. 27, 2023

(51) Int. Cl.
H10D 1/68        (2025.01)
H01L 23/31       (2006.01)

(52) U.S. Cl.
CPC .......... *H10D 1/68* (2025.01); *H01L 23/3107* (2013.01)

(58) Field of Classification Search
CPC ... H10D 1/68; H01L 23/3107; H01L 23/3171; H01L 23/642; H01L 25/03; A01K 67/364
See application file for complete search history.

(56) References Cited

U.S. PATENT DOCUMENTS

| 9,793,106 B2* | 10/2017 | Guo ................. H01L 21/02164 |
| 9,893,008 B2* | 2/2018 | Bonifield ............. H05K 1/0257 |
| 2004/0102000 A1* | 5/2004 | Leng ................. H01L 21/76838 |
| | | 438/584 |
| 2007/0246796 A1* | 10/2007 | Guo ..................... H01L 23/5256 |
| | | 257/E23.149 |
| 2009/0278245 A1* | 11/2009 | Bonifield ................ H01L 24/12 |
| | | 257/676 |
| 2019/0206812 A1* | 7/2019 | Bonifield ............. H01L 23/5223 |

OTHER PUBLICATIONS

Analog Devices Data Sheet; "16-Bit, Isolated Sigma-Delta Modulator AD7403-EP"; 2016; 12 pages.
Analog Devices Data Sheet; "Dual-Channel, 2.5 kV Isolators with Integrated DC-to-DC Converter"; 2012; 28 pages.

* cited by examiner

*Primary Examiner* — Robert G Bachner
(74) *Attorney, Agent, or Firm* — Andrew R. Ralston; Frank D. Cimino

(57) ABSTRACT

An integrated circuit includes a first isolation capacitor and a second isolation capacitor. The first isolation capacitor is electrically connected to a first circuit node and has first and second capacitor plates separated by a first dielectric stack. The second isolation capacitor is electrically connected in series between the first isolation capacitor and a second circuit node, and includes third and fourth capacitor plates separated by a second dielectric stack different from the first dielectric stack.

20 Claims, 6 Drawing Sheets

US 12,490,443 B2

HYBRID ISOLATION CAPACITORS IN SERIES

TECHNICAL FIELD

This disclosure relates to the field of semiconductor devices, and more particularly, but not exclusively, to capacitive (galvanic) isolation devices and methods for improved ramp-to-breakdown, surge voltage performance and IEC-ESD.

BACKGROUND

Isolation circuits are used extensively in implementations in which an electronic device such as a controller communicates with a device operating at a higher voltage, such as a motor or hybrid vehicle inverter. Designers value a high ramp-to-breakdown (RTB) voltage, high surge voltage, high IEC-ESD voltage, and long timed time-dependent dielectric breakdown (TDDB) in such devices.

SUMMARY

The inventors disclose various devices and methods that may be beneficially applied to isolation applications in integrated circuits (ICs) and systems, for example isolating a controller operating at a low voltage from a motor operating at a higher voltage. While such embodiments may be expected to provide improvements in performance and/or lifetime of such devices and systems, no particular result is a requirement of the present invention unless explicitly recited in a particular claim.

Examples provide semiconductor devices and methods of making the same. An integrated circuit includes a first isolation capacitor and a second isolation capacitor. The first isolation capacitor is electrically connected to a first circuit node and has first and second capacitor plates separated by a first dielectric stack. The second isolation capacitor is electrically connected in series between the first isolation capacitor and a second circuit node, and includes third and fourth capacitor plates separated by a second dielectric stack different from the first dielectric stack.

BRIEF DESCRIPTION OF THE DRAWINGS

For a detailed description of various examples, reference will now be made to the accompanying drawings in which.

DETAILED DESCRIPTION

The present disclosure is described with reference to the attached figures. The figures are not necessarily drawn to scale, and they are provided without implied limitation to illustrate various described examples. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

Toward a goal of increasing time-dependent reliability of isolation devices, the present disclosure provides a circuit including a first isolation capacitor using a first dielectric stack in series with a second isolation capacitor using a different second dielectric stack, the two isolation capacitors in series being sometimes referred to as a hybrid isolation capacitor.

The inventors have determined that implementing an isolation circuit using a first isolation capacitor having a first dielectric stack, e.g. a stack only including silicon-based dielectrics, with a second isolation capacitor having a second dielectric stack, e.g. including an organic dielectric, provides a synergistic improvement in the isolation characteristics of the circuit, at least with respect to ramp-to-breakdown characteristics of the isolation circuit. This approach unexpectedly provides current state-of-art class reliability of isolation circuitry without significant increase of cost.

Figure 1:
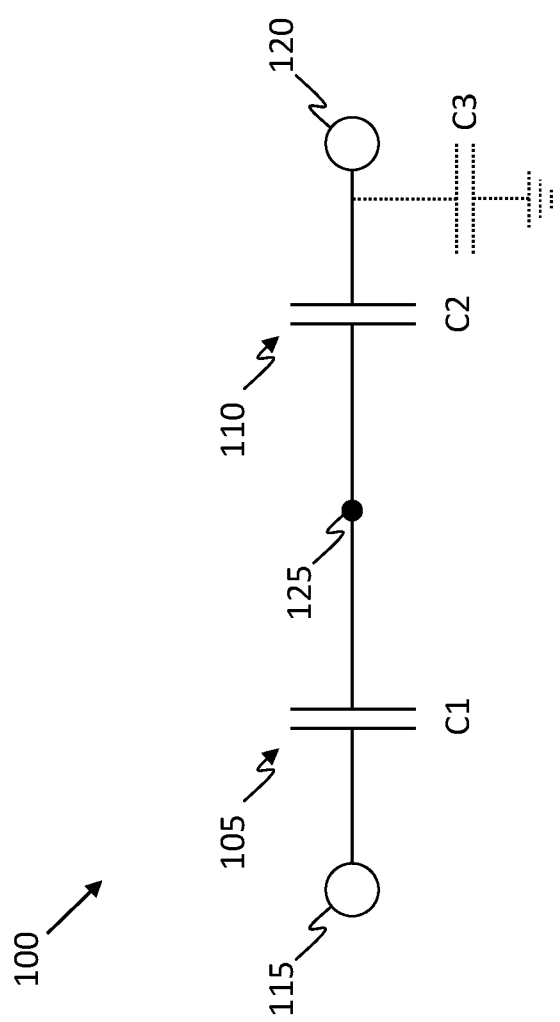
FIG. 1 illustrates an example hybrid isolation circuit of the disclosure including a first capacitor employing a first dielectric stack between capacitor electrodes, and a second capacitor employing a second dielectric stack between dielectric stack between capacitor electrodes, the first and second dielectric stacks being formed from different dielectric materials, and the first and second capacitors connected in series between two isolated circuit nodes.

FIG. 1 illustrates an example of a hybrid capacitive isolation circuit 100 that includes a first capacitor 105 (or C1) and a second capacitor 110 (or C2) connected in series between a first circuit node 115 and a second circuit node 120. One of the first and second circuit nodes 115, 120 may be a lower voltage node and the other of the first and second circuit nodes 115, 120 may be a higher voltage node, wherein the higher voltage may be at least 100 V greater than the lower voltage node. In the following discussion the circuit node 115 may be referred to without limitation as the high-voltage, or HV, circuit node, and the node 120 may be referred to without limitation as the low-voltage, or LV, circuit node. The LV circuit node 120 is illustrated as coupled to a capacitance C3 between the LV circuit node 120 and ground that represents a parasitic capacitance between the capacitor C2 and ground. Such parasitic capacitance may originate in the second capacitor 110 and/or input capacitance of an electronic device connected to the LV circuit node 120.

One of the capacitors 105, 110 includes at least some organic dielectric media between two capacitor plates, while the other one of the capacitors includes only inorganic dielectric media between two capacitor plates. Without implied limitation, the discussion below may refer to the capacitor 105 as the capacitor having at least some organic dielectric media, and may refer to the capacitor 110 as the capacitor having only inorganic dielectric media. As a convenient shorthand the capacitor 105 may be referred to as the "organic capacitor" and the capacitor 110 may be referred to as the "inorganic capacitor". While the organic capacitor 105 is shown connected to the HV circuit node 115 and the inorganic capacitor 110 is shown connected to the LV circuit node 120, the order of the capacitors may be reversed in other examples. In principle each of the capacitors 105, 110 may be formed over a same substrate, but due to different processing constraints on the organic and inorganic dielectric media, it may be convenient to form the organic capacitor 105 over a first substrate and to form the inorganic capacitor 110 over a different second substrate. Such substrates may be semiconductor substrates such as silicon, but this is not required.

Figure 2:
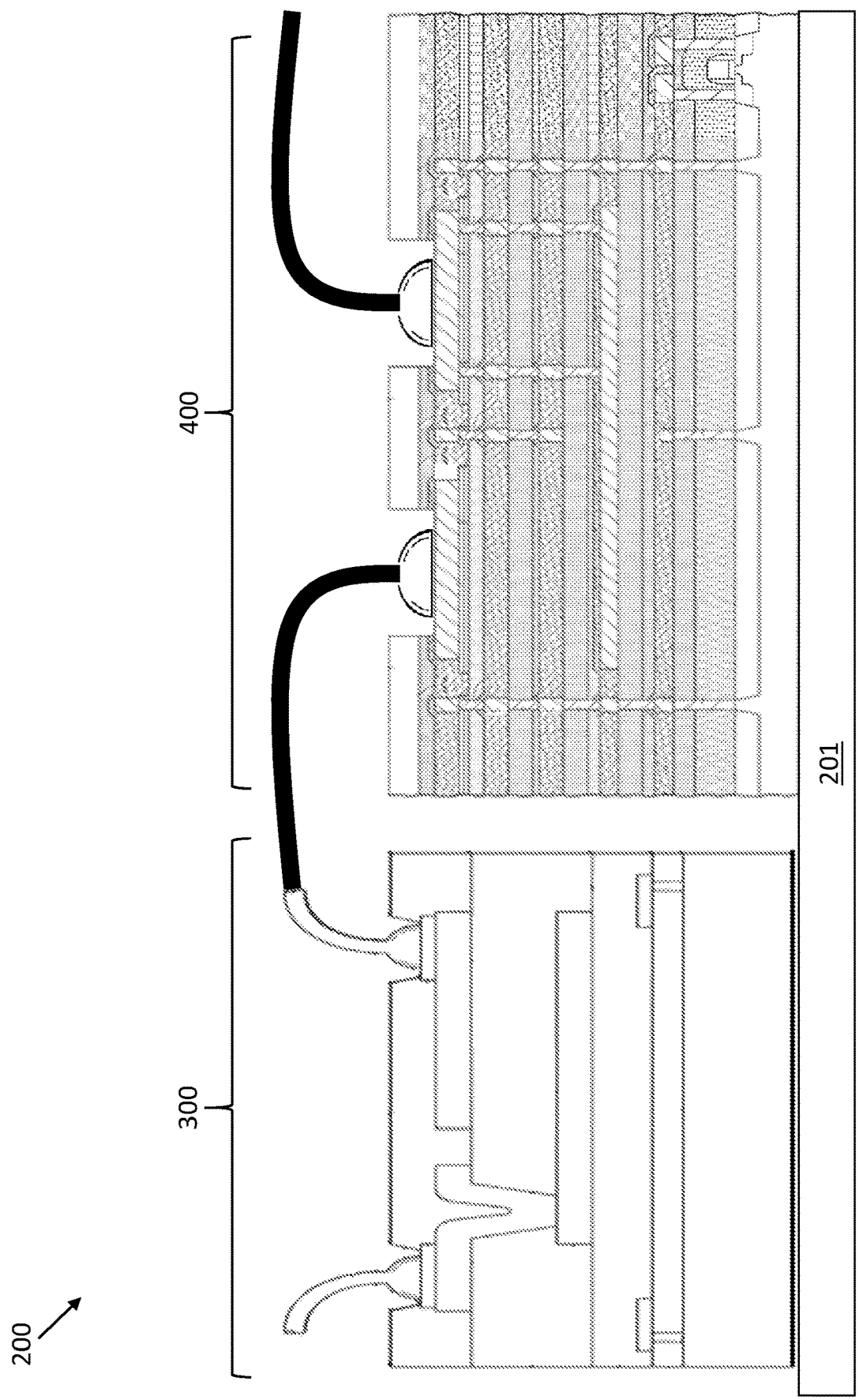
FIG. 2 show a section view of a hybrid isolation circuit device that advantageously includes a first isolation capacitor having an organic capacitor dielectric and a second capacitor having an inorganic capacitor dielectric.

FIG. 2 illustrates an example of a hybrid isolation circuit 200 implemented with an organic capacitor 300 formed over a first substrate and an inorganic capacitor 400 formed over a different second substrate. The capacitors 200 and 300 are attached to a common substrate 201, e.g. a package substrate such as a leadframe. Each capacitor 200, 300 includes a top plate and a bottom plate. In a nonlimiting example, the capacitors 200, 300 are connected at their respective top plates, e.g. by a bond wire. Additional bond wires may connect one of the capacitors 200, 300 to a HV circuit node, and the other one of the capacitors 200, 300 to a LV circuit node.

Figure 3:
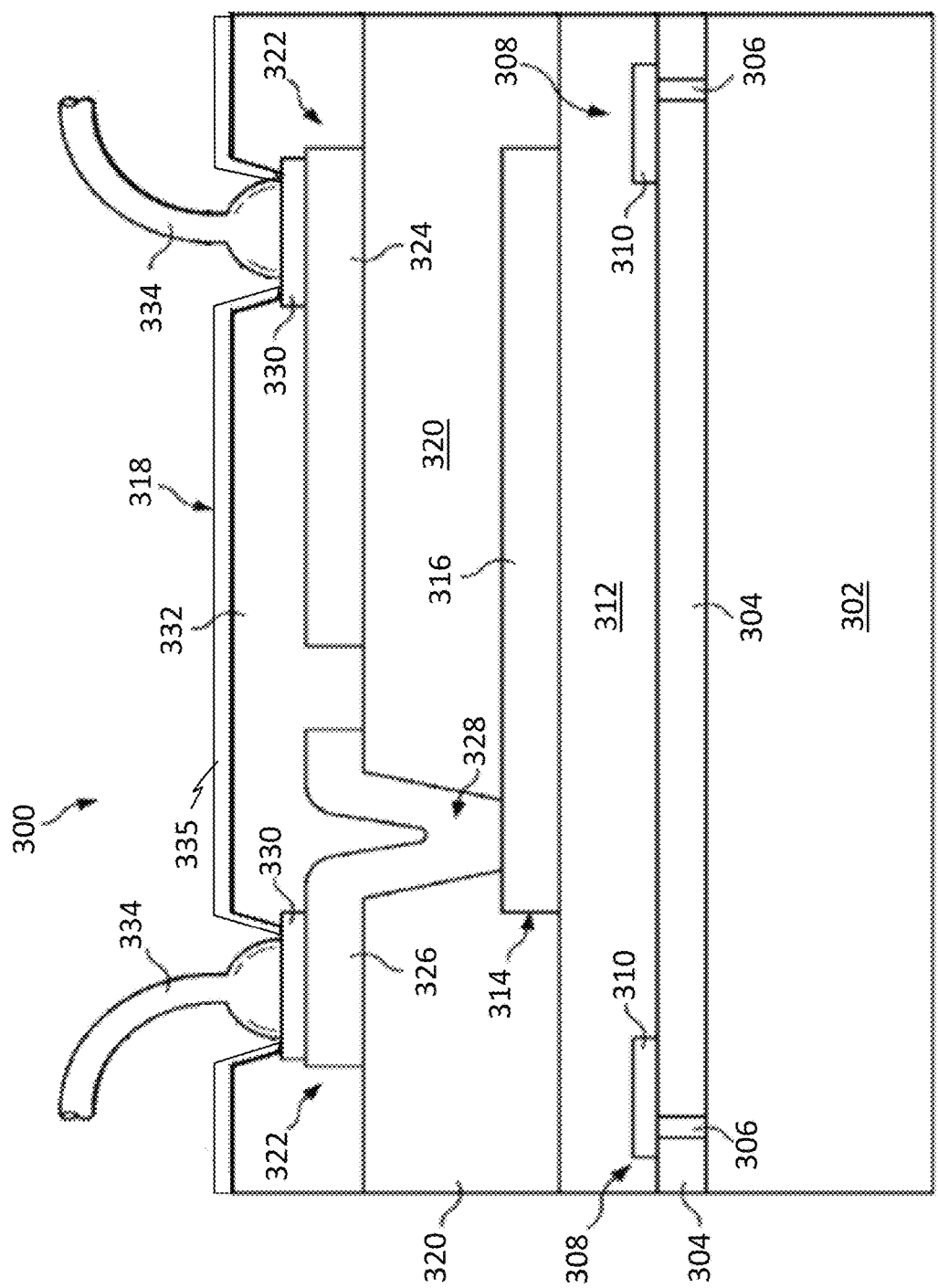
FIG. 3 shows a detailed section view of the first isolation capacitor of FIG. 2 having an organic dielectric.

FIG. 3 illustrates the organic capacitor 300 separately in greater detail. Some aspects of the organic capacitor 300 are summarized here, and additional details may be provided in U.S. Pat. No. 9,893,008 ("the '008 patent"), incorporated by reference in its entirety. While the capacitor 300 as described is a suitable example to implement the capacitive isolation circuit 100, other implementations within the scope of the disclosure may include an organic capacitor of another design. The capacitor 300 is formed on a monolithic substrate 302, which may be, for example, a single crystal silicon wafer 302. A pre-metal dielectric (PMD) layer 304 100 nm to 1000 nm thick is formed on the monolithic substrate 302. The PMD layer 304 may be, for example, one or more layers of silicon dioxide and silicon nitride. Contacts 306 are formed through the PMD layer 304 to make electrical connections to the monolithic substrate 302.

A first metal level 308 is formed over the PMD layer 304. The first metal level 308 includes a ground bus 310 which makes electrical connections to top surfaces of the contacts 306. A silicon dioxide layer 312 is formed over the first metal level 308 and over the PMD layer 304. A second metal level 314 is formed over the silicon dioxide layer 312. The second metal level 314 may have a main layer of copper or aluminum. The second metal level 314 includes a bottom plate 316.

A polymer dielectric layer 320 is formed over the second metal level 314 and over the silicon dioxide layer 312. The polymer dielectric layer 320 may be formed primarily of a layer of polyimide or PBO, though other polymers compatible with semiconductor fabrication technology may be used. In one example a photodefinable polyimide HD4100 may be used with satisfactory results. Upper via holes are formed in the polymer dielectric layer 320 so as to expose the second metal level 314.

A third metal level 322 is formed over the polymer dielectric layer 320. The third metal level may be formed of the same metals as the second metal level 314. The third metal level 322 includes a top plate 324. The third metal level 322 also includes a bottom plate lead 326 that extends into the upper via holes to form upper vias 328 which make electrical connection to the bottom plate 316. The bottom plate 316, the top plate 324 and the polymer dielectric layer 320 between the bottom plate 316 and the top plate 324 provide the capacitance of the capacitor 300. A capacitance of each capacitor 300 may be, for example, 50 to 250 femtofarads.

Bondpads 330 are formed over the third metal level 322 to provide connections to the top plate 324 and the bottom plate lead 326. Instances of the bondpads 330 over the top plates 324 are disposed over the bottom plates 316, which may advantageously reduce an area of the capacitor 300. A dielectric overcoat dielectric layer 332 is formed over the third metal level 322 and the polymer dielectric layer 320, exposing the bondpads 330. The dielectric overcoat dielectric layer 332 may be, for example, polyimide or PBO. Wire bonds 334 may provide a connection to the capacitor 400 and to the HV circuit node 115. An optional moisture barrier, e.g. aluminum oxide formed by atomic layer deposition, may be formed over the dielectric layer 332 to reduce moisture absorption and increase reliability of the capacitor 300. Additional details may be provided in U.S. Pat. No. 9,793,106 ("the '106 patent"), incorporated by reference in its entirety.

Figure 4:
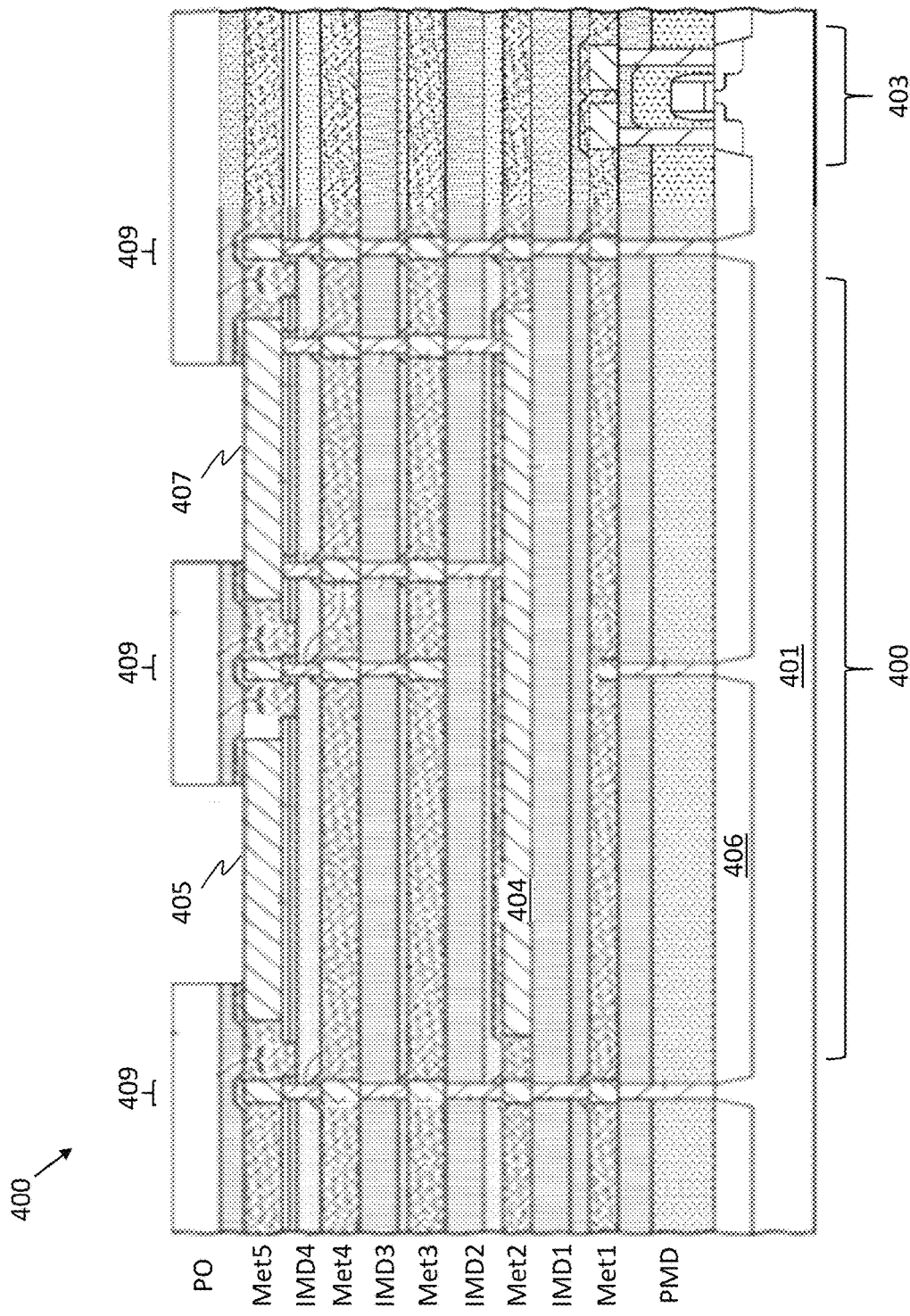
FIG. 4 shows a detailed section view of the second isolation capacitor of FIG. 2 having only an inorganic dielectric.

FIG. 4 illustrates the inorganic capacitor 400 separately in greater detail. Some aspects of the inorganic capacitor 400 are summarized here, and additional details may be provided in U.S. Patent Application No. 2019/0378892 ("the '892 application"), incorporated by reference in its entirety. While the capacitor 400 as described is a suitable example to implement the capacitive isolation circuit 100, other implementations may include an inorganic capacitor of another design. The capacitor 400 includes a semiconductor substrate 401 over which the capacitor 400 and an optional transistor 403 are formed. The transistor 403 is representative of active devices that may be integrated with the capacitor 400 to receive the reduced voltage signal provided by the isolation circuit 100. The capacitor 400 includes a first electrode 404 and a second electrode 405. Without implied limitation the first electrode 404 may be referred to as bottom plate 404, and the second electrode 405 may be referred to as top plate 405. In various examples the top plate 405 and the bottom plate 404 are about the same size and shape, and the bottom plate 404 is directly between the top plate 405 and the substrate 401 along a surface normal. The top plate 405 may be connected to the top plate of the capacitor 300 as illustrated in FIG. 2, while the bottom plate 404 and the transistor 403 may be connected to a low-voltage circuit node.

The example of FIG. 4 illustrates a five-level-metal (5LM) capacitor 400 without implied limitation thereto. The capacitor 400 therefore includes five metal levels designated MET1 . . . MET5. Each metal level includes metal features within a corresponding intra-metal dielectric (IMD) layer IMD1 . . . IMD5. An interlevel dielectric (ILD) layer is located between each IMD layer, such that there are dielectric layers ILD1 . . . ILD4. A PMD layer is located between the IMD1 level and the substrate 401, and a passivation overcoat (PO) layer overlies the top metal layer IMD5. An optional isolation structure 406, e.g. a shallow trench isolation structure, is located between the PMD layer and the substrate 401. The isolation structure 406 may reduce capacitive coupling between the bottom plate 404 and the substrate 401. In other examples, not shown, the isolation structure 406, if present, may include one or more doped well regions that may provide junction isolation between the bottom plate 404 and the substrate 401. The bottom plate 404 is located in the MET2 level in the illustrated example, but could be located in another metal level in other examples. The level in which the bottom plate 404 is located may be selected in part based on the desired isolation of the bottom plate 404 from the substrate 401, and the desired capacitive coupling to the top plate 405.

The plates 404 and 405 may be formed from any suitable metal. Examples described herein may describe the plates 404 and 405 as being formed from aluminum, but those skilled in the pertinent art will understand the described principles may be adapted to other metal interconnect systems, such as copper, without undue experimentation. The top plate 405 may be configured to receive a signal from the capacitor 300, e.g. via a wire ball-bonded to the top plate 405.

The top plate 405 is capacitively coupled to the bottom plate 404 through the one or more intervening dielectric layers, in the current example ILD2 . . . ILD4 and IMD2 . . . IMD4. The coupling may induce on the bottom plate 404 an attenuated electric signal corresponding to signal received at the top plate 405. The attenuated signal at the bottom plate 404 may then be coupled to another electronic device on another semiconductor substrate, or may be routed to an electronic device located on the same substrate, such as the transistor 403. The plates 404 and 405 may be located between via stacks 409 that connect to the substrate 401. The substrate 401 may provide a ground reference for the via stacks, such that the via stacks may provide a guard ring 409 that terminates electric field lines from the plates 404 and/or 405.

The top plate 405 may also serves as a first bond pad. A second bod pad 407 is spaced apart from the top plate 405. The bottom plate 404 extends under the bond pad 407, or an interconnect line or lines extend under the bod pad 407, and stacked vias connect the bottom plate 404 to the bond pad 407.

Figure 5:
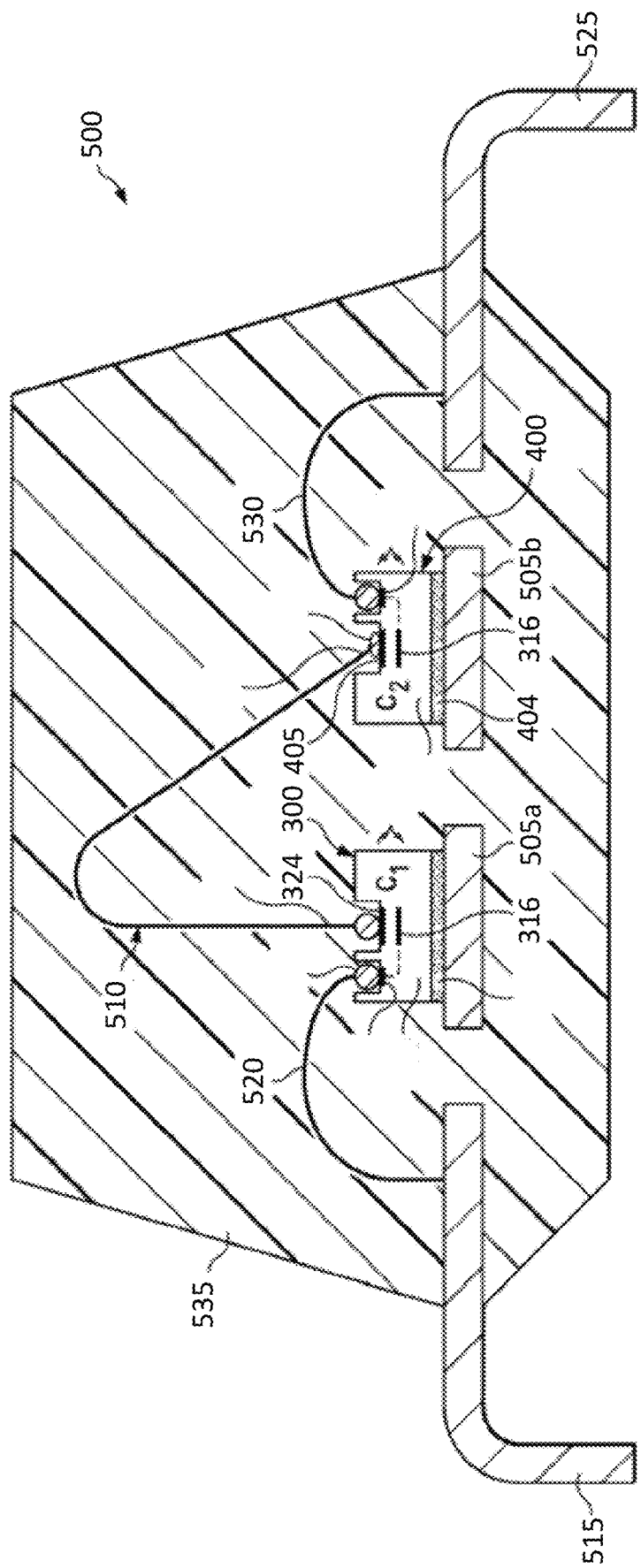
FIG. 5 shows a detailed section view of the isolation capacitor of FIG. 3 having an organic dielectric, and the isolation capacitor of FIG. 4 having an inorganic dielectric.

FIG. 5 is a cross sectional view of an example packaged multichip device 500 including the organic capacitor 300 and the inorganic capacitor 400 connected in series between two package leads, according to an example aspect. The capacitors 300, 400 in this view are stylized to remove unneeded details. Some aspects of the multichip device 500 are summarized here, and additional details may be provided in U.S. Pat. No. 10,366,958 ("the '958 patent"), incorporated by reference in its entirety.

The organic capacitor 300 and the inorganic capacitor 400 are each mounted by unreferenced adhesive to a package substrate provided by portions 505a and 505b of a leadframe 505. In some examples the capacitors 300, 400 may be mounted to a same continuous portion of the leadframe 505. The top plate 324 of the capacitor 300 is shown connected to the top plate 405 of the capacitor 400 by a bond wire 510, but the capacitors may be connected by any combination of top and bottom plates. The bottom plate 316 of the organic capacitor 300 is connected to a first package node 515 by a bond wire 520, and the bottom plate 404 of the inorganic capacitor 400 is connected to a second package node 525 by a bond wire 530. While shown as leads, the package nodes 515 and 525 may be any known or future-developed type of electrical package connection, including leaded, leadless, and ball grid or bump packages. In the illustrated example the assembly is encased by mold compound 535, though the multichip device 500 is not limited to any particular package type.

Figure 6:
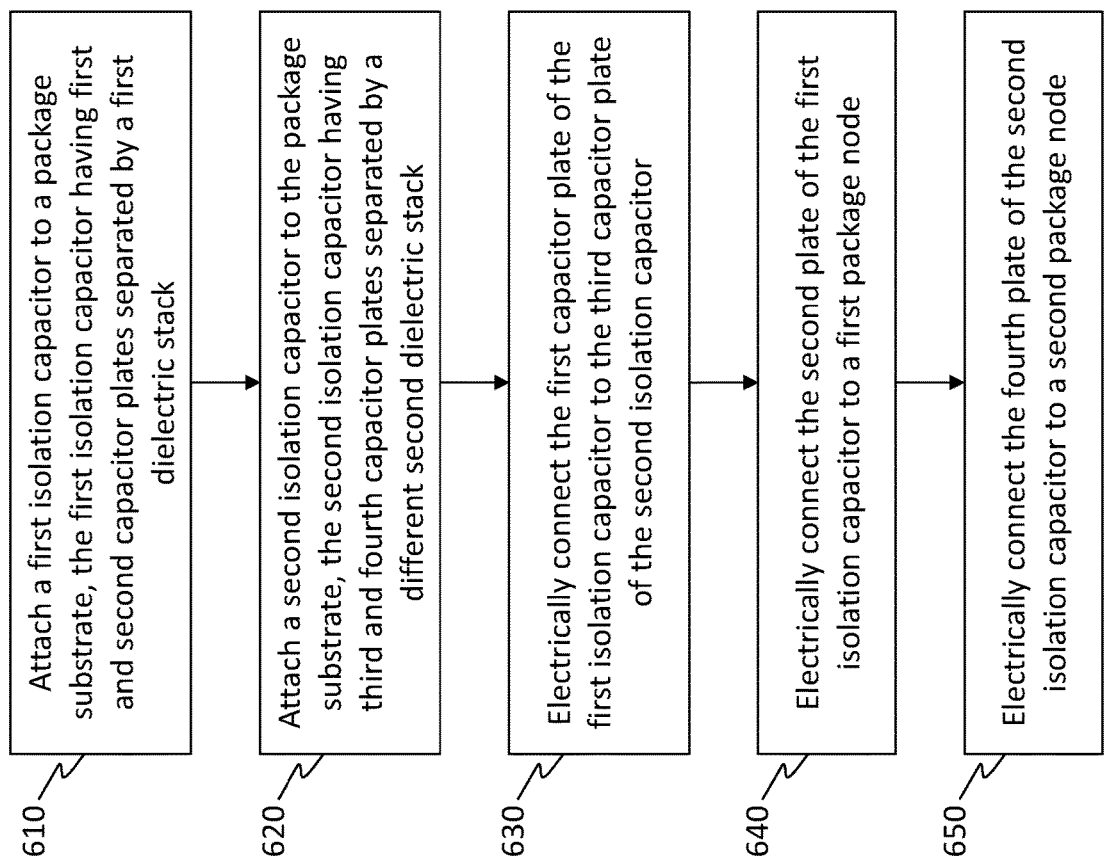
FIG. 6 shows a method of manufacturing a hybrid isolation capacitor, or integrated circuit, according to examples of the disclosure.

FIG. 6 illustrates a method 600 of forming an isolation circuit according to various examples and consistent with the preceding description. In a first step 610 a first isolation capacitor, e.g. the organic capacitor 300, is attached to a package substrate. The first isolation capacitor has a first capacitor dielectric stack, or medium, between first and second capacitor electrodes, or plates. In a second 620 a second isolation capacitor, e.g. the organic capacitor 400, is attached to the package substrate. The second isolation capacitor has a different second capacitor dielectric stack, or medium, between first and second capacitor electrodes, or plates. In a step 630 the first electrode of the first isolation capacitor is conductively connected to the first electrode of the second isolation capacitor. In a step 640 the second electrode of the first isolation capacitor is conductively connected to a first package node, and in a step 650 the second electrode of the second isolation capacitor is conductively connected to a second package node.

Referring again to FIG. 1, for an input voltage VH at the HV circuit node 115, a voltage VL at the LV circuit node 120 will be reduced by a factor determined in part by the value of C1, C2 and C3. With appropriate selection of these values, VL may be reduced by a factor of 20-100, e.g. a 100 VAC signal input at the HV circuit node 115 may result in a 1-5 VAC signal at the LV circuit node 120. During operation the capacitor dielectric media are stressed by resulting electric fields that over time may degrade the media and eventually lead to device failure, e.g. by dielectric breakdown and/or forming a low resistance connection between the capacitor terminals.

The reliability of the capacitors, separately or connected in series as exemplified in FIG. 1, may be characterized by one or more of RTB, surge capacity, ESD and TDDB. RTB applies an increasing voltage across the terminals of the device under test, e.g. at 1 $kV_{rms}$/s, until a failure such as dielectric breakdown occurs. Surge capacity is typically a pass/fail test for a predetermined voltage delivered in a short time period, e.g. 22 $kV_{rms}$ ramped in about 1 μs. ESD (air gap or contact electrostatic discharge) delivers a test voltage across an air gap and determines a voltage at which the device fails. And TDDB determines a time that dielectric breakdown occurs in a representative population of devices at a specific voltage, e.g. 5 $kV_{rms}$ These characterization protocols are described in IEC standard 60747-17, incorporated herein in its entirety, and together provide a useful tool to predict the reliability of the capacitive isolation circuit 100.

The use of the two capacitors 105 and 110 in the IC 100 may increase reliability, as characterized by one or more of RTB, surge capacity, ESD and TDDB, relative to an analogous circuit that uses a single capacitor between the circuit nodes 115 and 120. For example, for the case that C1≈C2 the voltage drop across each of the capacitors 105 and 110 may be about one-half of the voltage drop from the circuit node 115 to the circuit node 120. The reduced voltage drop reduces stress on the dielectric medium between the plates of each capacitor, and the resulting improved reliability may be quantified by TDDB and RTB characterization.

Some known baseline isolation circuits that employ two series-connected capacitors in an isolation circuit use capacitors having only silicon-containing inorganic dielectric media, e.g. silicon oxide, silicon nitride and/or silicon oxynitride. Refinement of some such capacitors has provided devices that are highly resistant to moisture uptake and dielectric breakdown, and exhibit long TDDB lifetime. For example, as described previously, the '892 application includes an isolation capacitor implemented in a five-level-metal process technology using inorganic dielectric media. In another example, the '958 patent, described previously, includes two isolation capacitors using silicon oxide in a same device package and connected in series. Characterization of one such example isolation circuit results in an RTB of 14 $kV_{rms}$, a surge tolerance of at least 8 $kV_{pk}$, an ESD tolerance of 10 kV (air gap), and a TDDB of at least 2 $kV_{rms}$.

Thus, while the polyimide-based example has a greater RTB and ESD tolerance, the silicon oxide-based example has a greater TDDB.

Some other known baseline isolation circuits that employ two series-connected capacitors in an isolation circuit use capacitors having only a polyimide dielectric medium. Isolation capacitors using a polymer dielectric medium offer advantages of low cost, flexible thickness, high surge voltage and high RTB, but have relatively poor moisture sensitivity, TDDB and frequency dispersion. Characterization of one such example isolation circuit results in an RTB of 18 $kV_{rms}$, a surge tolerance of 21 $kV_{pk}$, an ESD tolerance of 15 kV (air gap), and a TDDB of less than 800 $V_{rms}$.

However, the inventors have discovered that a hybrid capacitive isolation circuit using a capacitor having an organic (e.g. polyimide) dielectric in series with a capacitor having an inorganic (e.g. silicon oxide) dielectric provides a synergistic benefit that results in performance metrics that exceed the sum of performance metrics of the individual capacitors. The hybrid isolation circuit thereby provides exceptional performance unpredicted by the performance of the individual capacitors operating separately.

In one example, a first group of isolation capacitors exemplified by the capacitor 300 (FIG. 3) having a 25 μm polyimide capacitor dielectric were determined to have an RTB value of about 7.5 $kV_{rms}$, and a second group isolation capacitors exemplified by the capacitor 400 (FIG. 4) having 15.6 μm silicon oxide were determined to have an RTB value of about 8.6 $kV_{rms}$. However, a hybrid isolation circuit exemplified by the circuit 100 (FIG. 1) and the hybrid isolation circuit 200 (FIG. 2) was determined to have an RTB value of about 17.2 $kV_{rms}$, an endowment an additional 1 $kV_{rms}$ RTB margin. Increasing the polyimide thickness to about 30 μm may provide an RTB value of greater than 18 $kV_{rms}$, and acceptable values of surge capacity, ESD and TDDB.

This beneficial result was unexpected and not predictable from the separate RTB values of the polyimide capacitors and the silicon oxide capacitors. Furthermore, the measured surge capacity of the hybrid isolation circuit is as good or better than the measured surge capacity of the baseline series-connected polyimide capacitors and the baseline series-connected silicon oxide capacitors. Finally, the TDDB at 5 $kV_{rms}$ of the hybrid isolation circuit was found to be only slightly lower than the TDDB of the baseline series-connected silicon oxide capacitors, but well above the minimum TDDB needed to assure robust reliability.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method of forming an integrated circuit, comprising:
attaching a first isolation capacitor to a package substrate, the first isolation capacitor having first and second capacitor plates separated by a first dielectric stack including a first dielectric material composition;
attaching a second isolation capacitor to the package substrate, the second isolation capacitor having third and fourth capacitor plates separated by a second dielectric stack including a different second dielectric material composition;
electrically connecting the first capacitor plate of the first isolation capacitor to the third capacitor plate of the second isolation capacitor;
electrically connecting the second plate of the first isolation capacitor to a first package node; and
electrically connecting the fourth plate of the second isolation capacitor to a second package node.

2. The method of claim 1, wherein the first dielectric stack includes only silicon-based dielectric materials, and the second dielectric stack includes an organic dielectric material.

3. The method of claim 2, wherein the second dielectric stack includes a polyimide layer between the third and fourth capacitor plates.

4. The method of claim 1, wherein the first and second isolation capacitors are mounted on a same package substrate, and are connected in series between a first package node and a second package node.

5. The method of claim 1, wherein the second dielectric stack includes an organic material and the second isolation capacitor includes an aluminum oxide layer over the organic material.

6. The method of claim 1, wherein the second dielectric stack includes a polymer dielectric layer having a thickness of about 30 μm.

7. The method of claim 1, wherein the first dielectric stack includes 15.6 μm of silicon-based dielectric materials, and the second dielectric stack includes about 30 μm of polyimide.

8. The method of claim 1, wherein a ramp to breakdown between the first and second package nodes is greater than 18 $kV_{rms}$.

9. The method of claim 1, wherein a surge capacity between the first and the second package nodes is at least 22 $kV_{rms}$.

10. The method of claim 1, wherein the first and second isolation capacitors are mounted to a lead frame and packaged within a mold compound.

11. A method of forming an integrated circuit, comprising:
attaching a first isolation capacitor to a package substrate, the first isolation capacitor having first and second capacitor plates separated by a first dielectric stack including a first dielectric material;
attaching a second isolation capacitor to the package substrate, the second isolation capacitor having third and fourth capacitor plates separated by a second dielectric stack that excludes the first dielectric material;
electrically connecting the first capacitor plate of the first isolation capacitor to the third capacitor plate of the second isolation capacitor;
electrically connecting the second plate of the first isolation capacitor to a first circuit node; and
electrically connecting the fourth plate of the second isolation capacitor to a second circuit node.

12. The method of claim 11, wherein the first dielectric material includes an organic dielectric material.

13. The method of claim 11, wherein the first dielectric material includes a polyimide material.

14. The method of claim 11, wherein the first and second isolation capacitors are mounted on a same package substrate, and are connected in series between a first package node and a second package node.

15. The method of claim 11, wherein the second dielectric stack includes an organic material and the second isolation capacitor includes an aluminum oxide layer over the organic material.

16. The method of claim 11, wherein the first dielectric stack includes 15.6 μm of silicon-based dielectric materials, and the second dielectric stack includes about 30 μm of polyimide.

17. The method of claim 11, wherein a ramp to breakdown between the first and second circuit nodes is greater than 18 $kV_{rms}$.

18. The method of claim 11, wherein a surge capacity between the first and the second circuit nodes is at least 22 $kV_{rms}$.

19. The method of claim 11, wherein the first and second isolation capacitors are mounted to a lead frame and packaged within a mold compound.

20. A method of forming a packaged integrated circuit device, comprising:

attaching a first isolation capacitor to a package substrate, the first isolation capacitor having first and second capacitor plates separated by a first dielectric stack including a polyimide material;

attaching a second isolation capacitor to the package substrate, the second isolation capacitor having third and fourth capacitor plates separated by a second dielectric stack that includes only one or more inorganic dielectric materials;

forming a wirebond connection between the first capacitor plate of the first isolation capacitor and the third capacitor plate of the second isolation capacitor;

forming a wire bond connection between the second plate of the first isolation capacitor and a first package node; and forming a wire bond connection between the fourth plate of the second isolation capacitor to a second package node.

* * * * *